United States Patent [19]

Wu et al.

[11] Patent Number: 4,787,508

[45] Date of Patent: Nov. 29, 1988

[54] INTEGRATED CIRCUIT WAFER CONTAINER

[75] Inventors: Chin J. Wu, Hsin Chu Hsien; Genie Chen, Taipei; Pai Y. Cheng; I Ping Hu, both of Hsin Chu; Tsu J. Lu, Tao Yuan; Jenn J. Wang, Hsin Chu, all of Taiwan

[73] Assignee: Taiwan Semiconductor Manufacturing Co., Ltd., Hsin, Taiwan

[21] Appl. No.: 105,092

[22] Filed: Oct. 6, 1987

[51] Int. Cl.[4] ............................................. B65D 85/00
[52] U.S. Cl. .................................. 206/445; 206/508; 220/288
[58] Field of Search ............... 220/414, 288; 206/5.1, 206/444, 445, 456, 508

[56] References Cited

U.S. PATENT DOCUMENTS

| | | | |
|---|---|---|---|
| 2,948,387 | 8/1960 | Fishman | 206/5.1 |
| 2,967,607 | 1/1961 | Hollinger | 206/5.1 |
| 3,091,361 | 5/1963 | Gawron | 206/508 |
| 3,524,455 | 8/1970 | Hoogesteger | 206/5.1 |

Primary Examiner—Willis Little
Attorney, Agent, or Firm—Morton J. Rosenberg

[57] ABSTRACT

An integrated circuit (IC) wafer container for holding IC wafers is disclosed. The IC wafer container comprises an enclosure member and a body member. The body member has one or more longitudinal openings through which the IC wafers contained therein can be pinched out or sucked out safely by using a pincer or a vacuum sucker without damaging the IC wafers.

3 Claims, 6 Drawing Sheets

INTEGRATED CIRCUIT WAFER CONTAINER

BACKGROUND OF THE INVENTION

The present invention relates generally to an integrated circuit (IC) wafer container, and particularly to an IC wafer container which can be used to store and make easy access of IC wafers contained therein without damaging the IC wafers.

At present, IC wafers are commonly stored in a cylindrical container comprising a cover member 1 and a body member 2, as shown in FIG. 6. When taking the wafers out of the container, one has to hold the container upside down thereby making the wafers drop down. However, prior arts of this kind have the following drawbacks:

(A) Since IC wafers are very thin and fragile, it is very easy to damage the wafers if one is not very cautious when handling these containers.

(B) To fit the standard size of wafers, the containers are usually 6 inches in diameter. This size is too large for one's palm to grasp the cover member easily to open the containers.

SUMMARY OF THE INVENTION

Accordingly, it is the primary object of the present invention to provide a novel IC wafer container which can store and allow removal of IC wafers contained therein easily and safely.

It is a further object of the present invention to provide an IC wafer container which is so formed that one can open the container by using one's palm comfortably.

An embodiment of the present invention will now be described by way of example but not by way of limitation with reference to the accompanying drawings.

DETAILED DESCRIPTION OF THE PREFERRED EMBODIMENT

Figure 1:
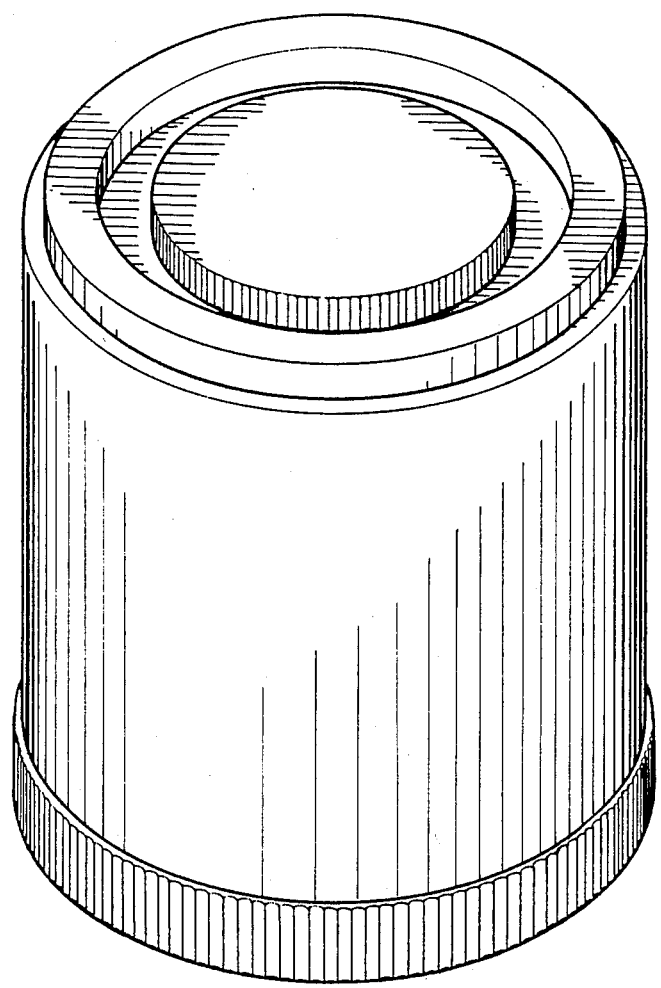
FIG. 1 is a perspective view of an IC wafer container in accordance with the present invention.

Referring to the drawings, FIG. 1 through FIG. 5, one embodiment of the IC wafer container according to the present invention is illustrated.

Figure 2:
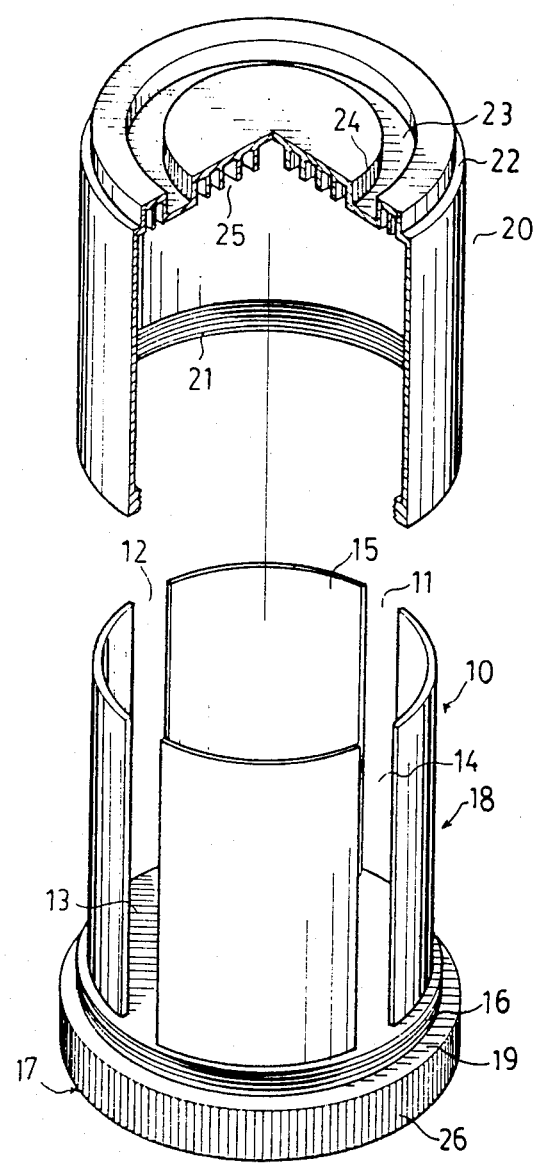
FIG. 2 is an exploded view of an IC wafer container in accordance with the present invention.
Figure 4:
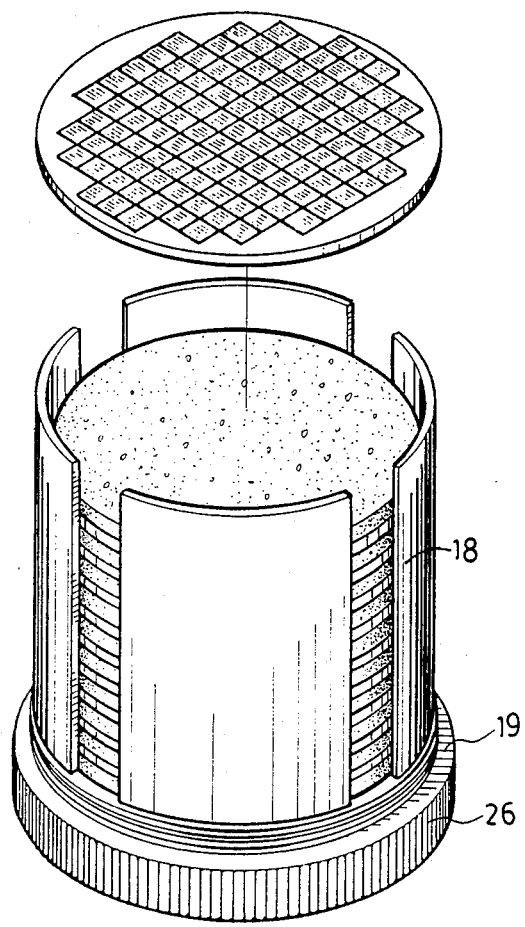
FIG. 4 is a perspective view of a body member of an IC wafer container with a plurality of IC wafers therein.

As can be seen in FIG. 2, the IC wafer container comprises two parts: an enclosure member 20 and a body member 10. The body member 10 is formed of a hollow cylindrical body 18, a circular base 16 and a circular base 17 having a larger diameter than that of base 16. The cylindrical body has one or more longitudinal openings 11, 12, 13 and 14, which extend axially throughout the peripheral surface thereof, whereby the IC wafers contained therein can be pinched out or sucked out by using a pincer or a vacuum sucker, as can be seen in FIG. 4. The base 16 has a plurality of screw threads around the circumference thereof. The base 17 is composed of an annular plate 19 and a shallow cylinder 26 attached to each other so that the inside portion of base 17 is mostly hollow.

Figure 3:
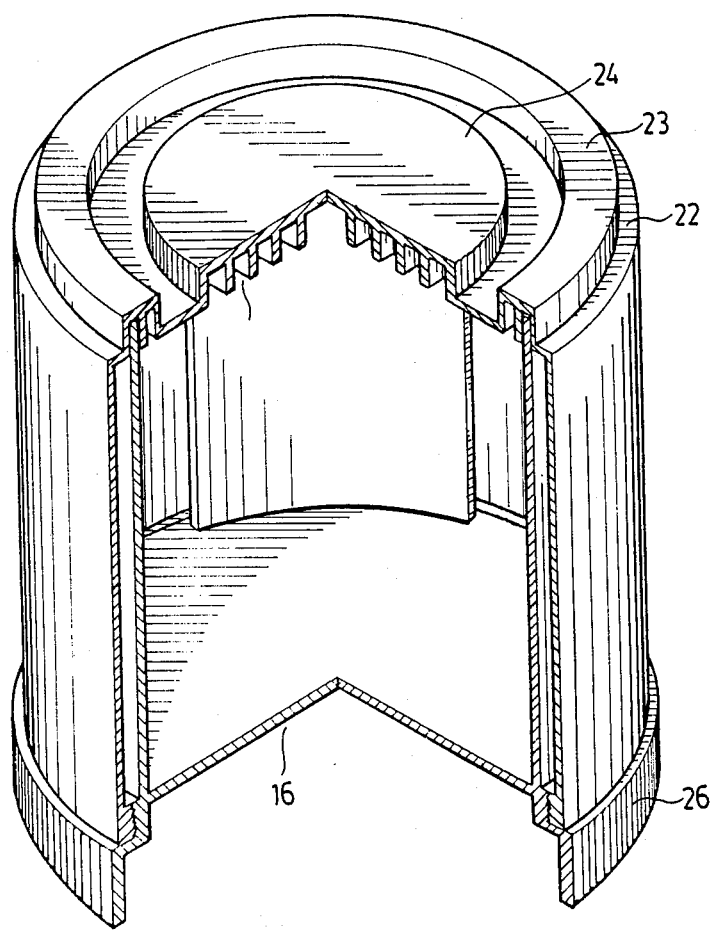
FIG. 3 is a cutaway view of an IC wafer container in accordance with the present invention.
Figure 5:
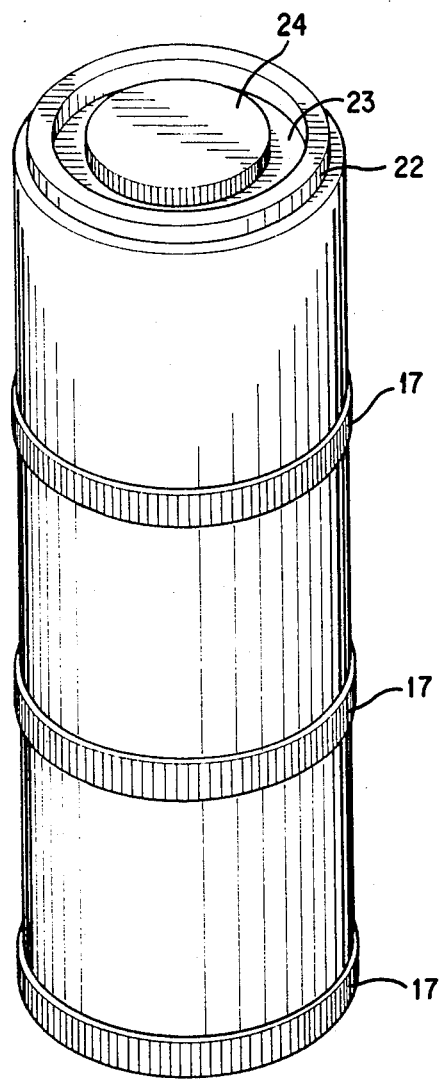
FIG. 5 is a perspective view of these IC wafer containers in accordance with the present invention piled up together.
Figure 6:
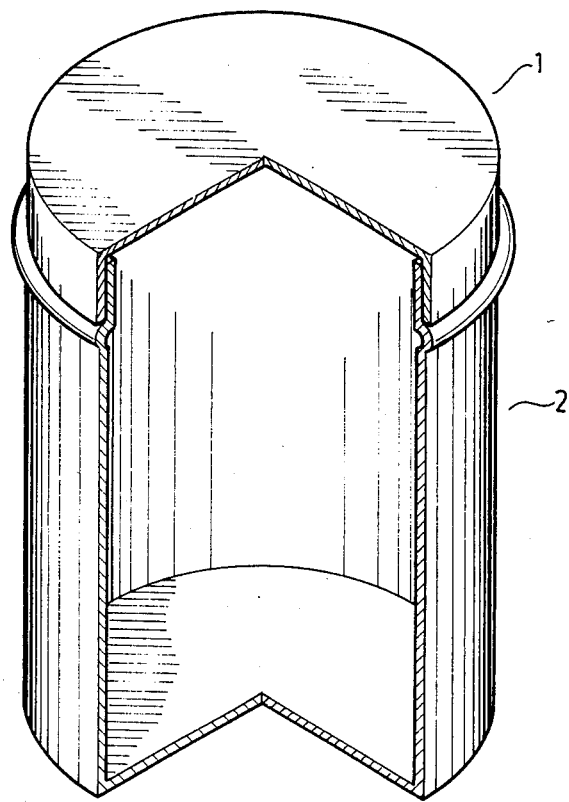
FIG. 6 is a perspective view of a prior art IC wafer container.

Now looking at the enclosure member 20, it can be seen that the enclosure member 20 is a hollow cylinder in shape with a dimension such that the enclosure member 20 is just able to cover and enclose the cylindrical body 18 and the circular base 16 of the body member, thus forming two layers of shield to protect the wafers inside the body member 10. At the top side of the enclosure member, an annular protuberance 11 is in the near-outermost portion thereof. Also formed on the top of the enclosure member is a circular protuberance 24 around the center thereof. An annular indentation 23 is accordingly formed between the annular protuberance 22 and the circular protuberance 24. The annular protuberance 22 is used to combine with the base 17 of the body member so that while a plurality of these IC wafer containers are securely stackable the annular protuberance 22 of one container is just able to fit into the hollow portion of the base 17 of the container lying thereon as shown in FIG. 5. The circular protuberance 24 is to be used for one's palm to open the container easily, because the diameter of an IC wafer container is usually about 6 inches, which is larger than one's palm can easily grasp. The presence of the circular protuberance 24 having a smaller diameter than that of the container enables one to put a palm on the circular protuberance to open the container. From FIG. 2 and FIG. 3, it also can be observed that the annular protuberance 22 and the circular protuberance 24 consist of a plurality of annular groves 25, which are to be used to press upon the IC wafers when the container is full of IC wafers. At the bottom of the enclosure member 20, a plurality of screw threads are provided to combine with the screw threads 16 of the body member whereby the container can be closed securely, as can be seen in FIG. 3.

From the aforesaid, the construction and operation of the device will be readily understood and further explanation is believed to be unnecessary. However, since numerous modifications and changes will readily occur by those skilled in the art, it is not desired to limit the invention to the exact construction shown and described, and accordingly all suitable modifications and equivalents are considered to be within the scope of the appended claims.

I claim:

1. An integreated circuit wafer container for containing integrated circuit wafers therein, comprising:

an enclosure member and a body member, said enclosure member and said body member having respective longitudinally directed portions, said enclosure member being slidably insertable over said body member in said longitudinal direction in overlapping relation, said body member and said enclosure member being threadedly coupled each to the other by matingly engaging screw threads formed at a bottom portion of said enclosure member and said body member, respectively, a two-layer shield being formed to provide increased protection for said integrated circuit wafers therein, said body member having at least one longitudinal opening formed therethrough, thereby facilitating handling of said integrated circuit wafers.

2. The integrated circuit wafer container as recited in claim 1 wherein a top portion of said enclosure member has an annular protuberance in the near-outermost portion thereof and said bottom portion of said enclosure member has a circular indentation such that said annular protuberance of one wafer container is engageable with said circular indentation of another wafer container seated atop whereby a plurality of said integrated circuit wafer containers are securely stackable.

3. The integrated circuit wafer container as recited in claim 2, wherein an annular indentation is formed adjacent to said annular protuberance so that a circular protuberance having a smaller diameter is formed thereby, said annular protuberance being used to facilitate opening and closing of said integrated circuit wafer container.

* * * * *